US006785354B1

(12) United States Patent
Dietrich

(10) Patent No.: US 6,785,354 B1
(45) Date of Patent: Aug. 31, 2004

(54) LOCK DETECTION SYSTEM FOR USE IN HIGH SPEED COMMUNICATION SYSTEMS

(75) Inventor: Casper Dietrich, Roskilde (DK)

(73) Assignee: Intel Corporation, Santa Clara, CA (US)

(*) Notice: Subject to any disclaimer, the term of this patent is extended or adjusted under 35 U.S.C. 154(b) by 601 days.

(21) Appl. No.: 09/722,337

(22) Filed: Nov. 28, 2000

(51) Int. Cl.[7] .............................................. H03D 3/24
(52) U.S. Cl. ..................... 375/373; 327/18; 331/DIG. 2
(58) Field of Search ............................. 327/18, 47, 48, 327/141, 12, 25, 43, 41; 375/354, 371, 373, 376, 375, 360, 374; 331/DIG. 2

(56) References Cited

U.S. PATENT DOCUMENTS

| | | | | |
|---|---|---|---|---|
| 4,675,558 A | * | 6/1987 | Serrone et al. ................ | 327/41 |
| 4,724,402 A | * | 2/1988 | Ireland ............................ | 331/4 |
| 4,870,382 A | * | 9/1989 | Keate et al. .................... | 331/4 |
| 5,337,335 A | * | 8/1994 | Cloetens et al. ............. | 375/376 |
| 6,229,864 B1 | * | 5/2001 | DuFour ....................... | 375/375 |
| 6,377,082 B1 | * | 4/2002 | Loinaz et al. ................ | 327/20 |

* cited by examiner

*Primary Examiner*—Jean B. Corrielus
(74) *Attorney, Agent, or Firm*—Blakely, Sokoloff, Taylor & Zafman LLP

(57) ABSTRACT

A lock detection method for generating a lock signal including providing a data signal and a clock signal to a clock detection unit, the data signal being describable by an eye pattern, the data signal and the clock signal being in lock when a data transition occurs in the center of a first transition period. A lock detection unit including: detection of absence or presence of a data transition of the data signal in a first partial period centered around the center of the first transition period and generating a first output signal having a first logic value in response to the presence of a data transition and having a second logic value in response to the absence of a data transition in the first partial period, detection of absence or presence of a data transition of the data signal in a second partial period centered around the center of the eye and generating a second output signal having a first logic value in response to the absence of a data transition and having a second logic value in response to the presence of a data transition in the second partial period, and comparing the first and second output signals and generating a lock signal according to the comparison.

13 Claims, 4 Drawing Sheets

LOCK DETECTION SYSTEM FOR USE IN HIGH SPEED COMMUNICATION SYSTEMS

FIELD OF THE INVENTION

The present invention relates to a lock detection system for detection of whether for example a phase or frequency locked loop has caught lock. The lock detection system being for use in high speed communication systems.

BACKGROUND OF THE INVENTION

In high speed communication systems, it is upon transmission and/or reception of digital data signals normally required to synchronise the transmitted data bits with a clock signal. Normally, it is necessary to provide a reference clock signal to the transmission circuit, for example by providing an external reference clock signal to the transmission circuit where after the reference clock signal is synchronised, such as phase or frequency locked, to the data signal before sampling of the data signal with the synchronised clock signal.

To verify whether the system has caught lock or not, i.e. whether the clock and data signals are synchronised, a frequency difference between for example a controlled oscillator of the transmission circuit and the reference clock may be detected whereby information of whether the clock and data signals are synchronised, i.e. whether the data signal and the clock signal have caught lock, is provided. Alternatively, the controlled oscillator may be aligned to the reference clock or swept continuously.

To avoid the need for providing an external clock to the system, the present invention relates in a first aspect to a lock detection method for generating a lock signal, the method comprising the steps of providing a data signal and a clock signal to a lock detection unit, the data signal being describable by an eye pattern, the data signal and the clock signal being in lock when a data transition occurs in the center of a first transition period, the lock detection unit comprising: detection of absence or presence of a data transition of the data signal in a first partial period centered around the center of the first transition period and generating a first output signal having a first logic value in response to the presence of a data transition and having a second logic value in response to the absence of a data transition in the first partial period, detection of absence or presence of a data transition of the data signal in a second partial period centered around the center of the eye and generating a second output signal having a first logic value in response to the absence of a data transition and having a second logic value in response to the presence of a data transition in the second partial period, and comparing the first and second output signals and generating a lock signal according to the comparison.

According to a second aspect of the present invention a lock detection system for generating a lock signal is provided, the system comprising a phase or frequency locked loop providing a data signal and a clock signal, the data signal being describable by an eye pattern, the data signal and the clock signal being in lock when a data transition occurs in the center of a first transition period, a lock detection unit for detection of absence or presence of a data transition of the data signal in a first partial period centered around the center of the first transition period and generating a first output signal having a first logic value in response to the presence of a data transition and having a second logic value in response to the absence of a data transition in the first partial period, detection of absence or presence of a data transition of the data signal in a second partial period centered around the center of the eye and generating a second output signal having a first logic value in response to the absence of a data transition and having a second logic value in response to the presence of a data transition in the second partial period, and comparing means for comparing the first and second output signals and generating a lock signal according to the comparison.

The eye pattern is a pattern defined as the synchronized superposition of all possible realizations of the data signal viewed within a particular signalling interval. The data signal is thus capable of being described by an eye pattern, so as to provide an evaluation of the overall system performance including effects of receiver noise, intersymbol interference, etc. Typically, the eye pattern has an eye opening which may be termed the eye opening period where only a few transitions occurs and a transition period wherein the majority of transitions occurs. When the clock signal and the data signal are in lock, the transitions will preferably occur substantially in the center of the transition period and the period wherein the transitions occur are termed a 'first partial period', the first partial period being centered around the center of the transition period, whereas there will be no transitions in the center of the eye opening period and the period wherein there are substantially no transitions are termed a 'second partial period', the second partial period being centered around the center of the eye opening period. If, for example, the length of the period of the data signal is T, the length of the first and the second partial periods may be T/2.

The data signal and the clock signal may be provided to the lock detection unit from a phase or frequency locked loop. The phase or frequency locked loop may comprise a phase or frequency detector, such as a bang bang phase detector and a controlled oscillator, preferably a voltage controlled oscillator. The lock detection system may further comprise a sweep generator adapted to sweep the voltage applied to the voltage controlled oscillator of the phase or frequency locked loop. The sweep generator is enabled when the lock detection signal is set, and the phase or frequency locked loop is hereby able to catch lock again.

Preferably, the lock detection unit comprises a bang bang phase detector. Furthermore, the lock detection unit may comprise a delay circuit adapted to shift the phase of the incoming clock signal received from the phase or frequency locked loop substantially 90° in relation to the incoming clock signal. If, for example, the period of the data signal is T, the delay circuit may be adapted to delay the incoming clock signal by ¼ of the period, i.e. ¼ T.

The lock signal may be provided to any comparing means for comparing the first and second output signals. The comparing means may, for example, count the number of data transitions in the first and the second partial period, and on the basis of the number of transitions in the first and the second partial period, respectively, determine whether the system has caught lock or not. If, for example, the number of data transitions in the first partial period is substantially equal to the number of data transitions in the second partial period, the data transitions are randomly distributed and, hence, the system is out of lock, so that the lock signal is set thereby triggering the sweep generator. Correspondingly, if the number of data transitions in the first partial period is substantially larger than the number of data transitions in the second partial period, indicating that the data transitions occur in the center of the transition period so that the clock signal and the data signal are synchronised, no enabling signal will be set.

The comparing means may, thus, comprise a counter, the first and the second output signals being provided to the counter so that when there is transmission in the first partial period, a valid state, the counter will be incremented, whereas a transmission in the second period, a non valid state, will decrement the counter. When the system is in lock, the counter will run off. Otherwise, the counter will not run off in a prescribed time interval and the lock signal will be set and the sweep generator enabled.

The comparing means may for example comprise a charge pump. The first and the second output signals may thus be provided to the charge pump, and when a transmission has been detected in the first partial period, a valid state, the charge pump will be charged and correspondingly, the charge pump will be discharged when a transmission in the second partial period, a non-valid state, has occurred. The charge pump may for example be discharged through a leakage current. When the charge pump voltage then decreases to below a pre-set reference voltage indicating that the number of data transitions in the first partial period is not substantially larger than the number of data transitions in the second partial period, the lock signal will be set and the sweep generator may be enabled.

BRIEF DESCRIPTION OF THE DRAWINGS

The invention will be described in greater detail below with reference to the drawings in which.

DETAILED DESCRIPTION OF THE DRAWINGS

The disclosed circuits hereunder are preferably integrated on a single or several integrated circuits. To support the required high-speed operation of the circuits, logic gates and circuit blocks are preferably implemented as CML logic using bipolar transistors. The preferred process is a 0.4 μm bipolar process suitable digital circuits operating within the frequency range of about 622 MHz to 50 GHz. The NPN transistors provided by this process have $f_T$ values of about 25 GHz. Alternatively, any available processes, such as FET, CMOS, Bipolar, etc., or any combinations thereof may be applied. In another alternative, processes capable of providing sufficiently fast transistors may be applied in some circuits according to the present invention operating at a low system frequency, and applying other processes for the circuits operating at a higher system frequency.

Figure 1:
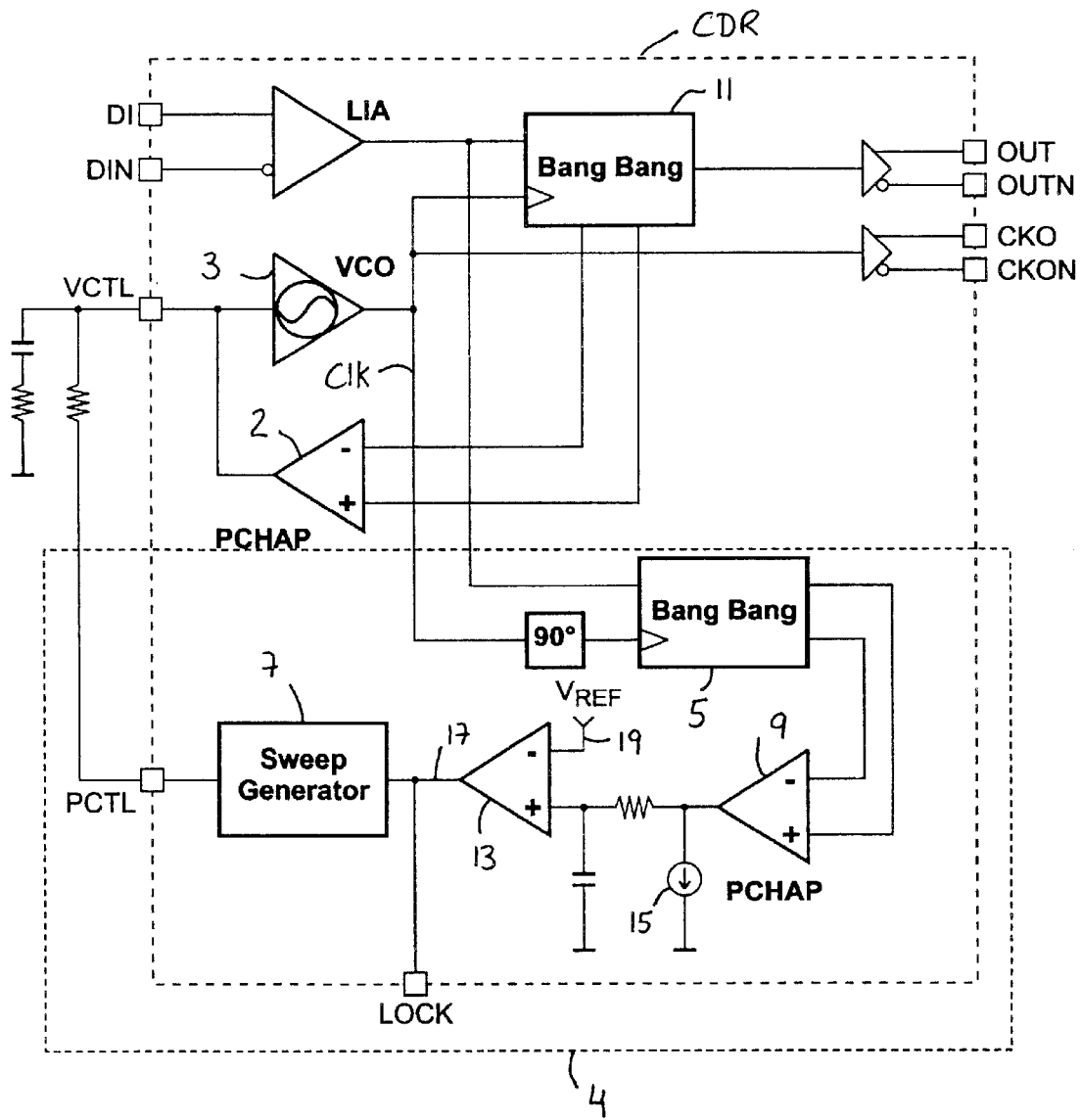
FIG. 1 shows an example of a clock and data recovery system comprising a lock detection system according to the present invention.

FIG. 1 shows a clock and data recovery circuit 1 according to the invention. A digital data signal DIN is received from a preceding circuit (not shown) which may typically form part of a node in an optical teletransmission system. This optical teletransmission system may operate in accordance with any standard digital and data telecommunications protocols, such as SDH STM-1–STM-128, Ethernet GE 1.250 Gbit/s–10 Gbit/s, utilising data rates of about 155 MHz, 622 MHz, 2.5 GHz, 10 GHz, 12.50 GHz, or even up to 40 GHz.

The circuit(s) in FIG. 1, is (are) designed for use at very high frequencies, i.e. frequencies in the GHz range, causing the bit period of the data signal to be very short. At 2.5 GHz the bit period is only 400 ps. Due to process and temperature variations, the temporal position of the data signal and the clock signal with respect to each other may vary, and this may be the case on the actual clock and data recovery circuit as well as on the preceding circuits. It is therefore important to ensure that when a digital data signal is sampled by a clock signal, the clock signal and the data signal are actually locked to each other, for example by a phase or frequency locked loop, so that the data signal is actually sampled in the center of the bit period, or in the center of the eye diagram as it is also termed.

In FIG. 1 a standard CDR circuit 1 is shown diagrammatically. The incoming data signal DIN being sampled in the lead lack detector 11 by an internally generated clock signal Clk provided by a voltage-controlled oscillator 3. The clock signal Clk produced by the oscillator 3 is then used in the lead lack detector 11 for sampling the data signal DIN which is thus retimed in such a way that it is synchronised with the clock signal Clk. To ensure that the sampling of the data signal DIN in the lead lack detector 11 is performed at the correct point in time with respect to the data signal also the phase of the clock signal Clk and the data signal DIN may be adjusted, since, due to the very short bit periods the data signal is stable for only a very short period, for which reason even a very small phase difference may result in the data signal not being sampled in the center of the bit period where it is stable.

The bang bang phase detector 11 compares the internal clock signal Clk with the data signal DIN and produces a signal at its output, said signal being a measure of the phase difference between the two signals, and thus between the optimum sampling time and the actual sampling time. This offset signal is provided to comparator 2 and filtered before it is provided to the voltage controlled oscillator 3. This results in a phase change of the voltage-controlled oscillator 3, and thus of the clock signal.

In order to control the lock status of the CDR circuit 1, the clock signal is further provided to a lock detection unit 4, wherein a phase difference between the digital data signal and the clock signal shifted 90° is detected in bang bang phase detector 5 to obtain an output signal depending on the phase difference between the two signals.

Figure 2:
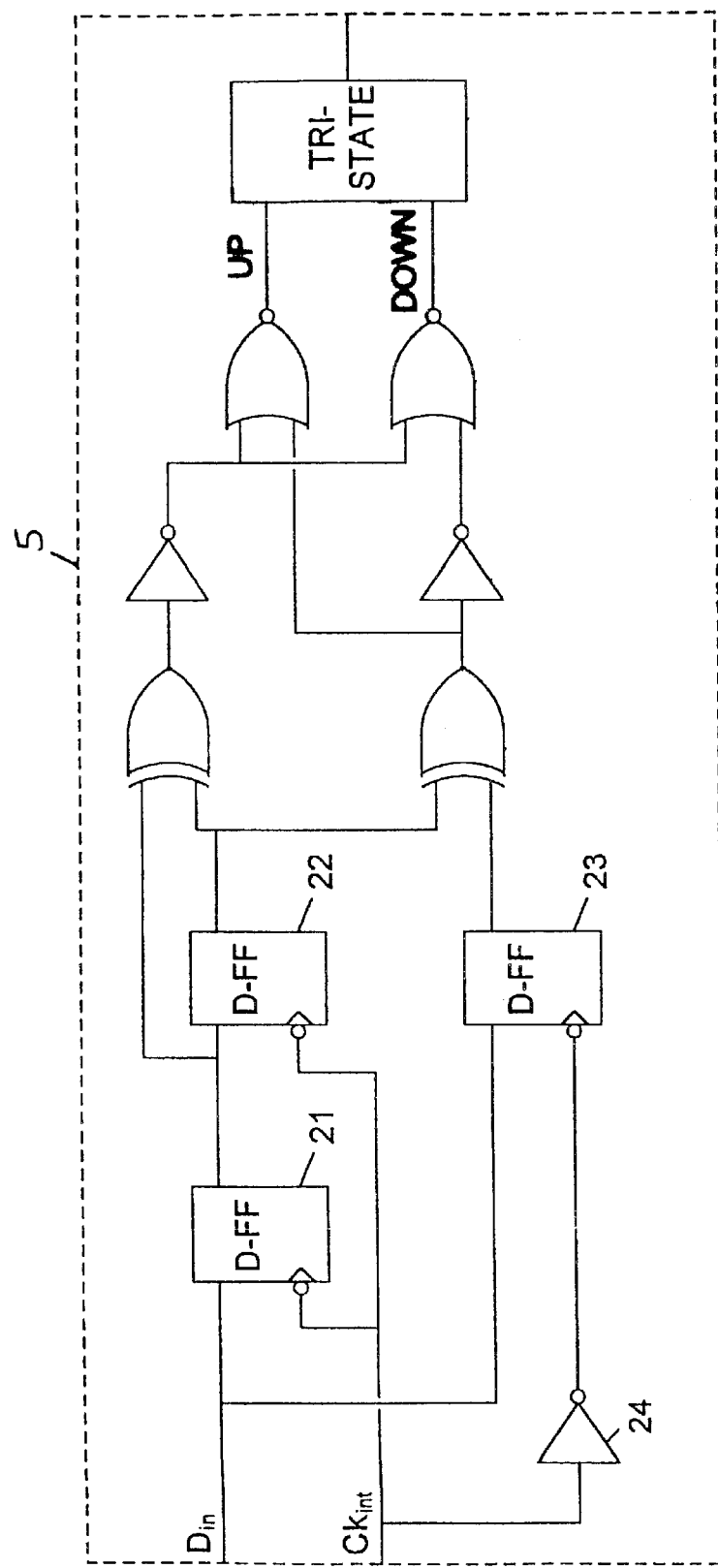
FIG. 2 shows an electronic circuit diagram of a bang bang phase detector to be used in the lock detection system shown in FIG. 1.

FIG. 2 shows an example of the structure of the bang bang phase detector 5. As mentioned above, the bang bang phase detector 5 compares the 90° shifted internal clock signal Clk to the data signal DIN and provides a signal at its output, said signal being indicative of the difference between the optimum sampling time and the actual sampling time and hence indicative of whether the system has caught lock or not. This is effected by the 90° shifted clock signal Clk being used for sampling the data signal DIN in three flip-flops 21, 22, 23 at three different points in time.

The phase locked loop of the clock and data recovery circuit, CDR circuit, provide, to the lock detection unit, a digital data signal DIN being sampled by the clock signal Clk in the center of the eye or in a partial period centered around the center of the eye, on condition that the phase or frequency locked loop has caught lock. If the CDR circuit has not caught lock, the data transition will take place at any random time in the period without being limited to any partial period of time. To verify that the system has caught lock corresponds, thus, to the determination of whether a substantial part of the data transitions takes place substantially at the center of the transition period, or at least in a partial period of time being centered around the center of the transition period.

The bang bang phase detector 5, thus, generates two signals UP and DOWN. If there has been no transition from the preceding to the present bit period, both signals UP and DOWN will be logically '0', since it is impossible, in this situation, to extract information about the position of the sampling time. If, on the other hand, there has been a shift from the preceding to the present bit period, the signal UP will be logically "1" if the shift from the preceding to the present bit period having taken place in a partial period centered around the center of the transition period. Likewise, the signal DOWN will be logically "1", if the shift from the preceding to the present bit period having taken place in a partial period centered around the eye of the eye pattern, so that the data transition has taken place at a time significantly different, i.e. distinct, from the center of the transition period.

With reference again to FIG. 1, the two signals UP and DOWN are led to a comparator 9 in order to convert the two signals to a single lock signal which may trigger the sweep generator 7 to sweep the voltage of the VCO 3 if the lock signal is set. When the signal UP is logically "1", the comparator 9 is charged so that the voltage at comparator 13 is increased. Similarly, when the signal DOWN is logically "1", the comparator 9 is discharged through leakage current 15 whereby the voltage at comparator 13 is decreased. The output of the comparator is the lock signal 17. If the voltage at the comparator 13 drops below a pre-set reference voltage 19, corresponding to a significant amount of transitions having taken place in the partial period centered around the center of the eye, the lock signal is set, and the sweep generator 7 is enabled. When both signals UP and DOWN are "0", the comparator 9 is not affected, nor charged nor discharged.

Consequently, the standard CDR circuit is controlled on an ongoing basis so that the sweep generator is enabled when the CDR circuit is out of lock whereby the VCO will be able to catch or re-catch lock so that the data transition will take place substantially in the center of the bit period, without the need for providing an external reference clock signal.

Figure 3:
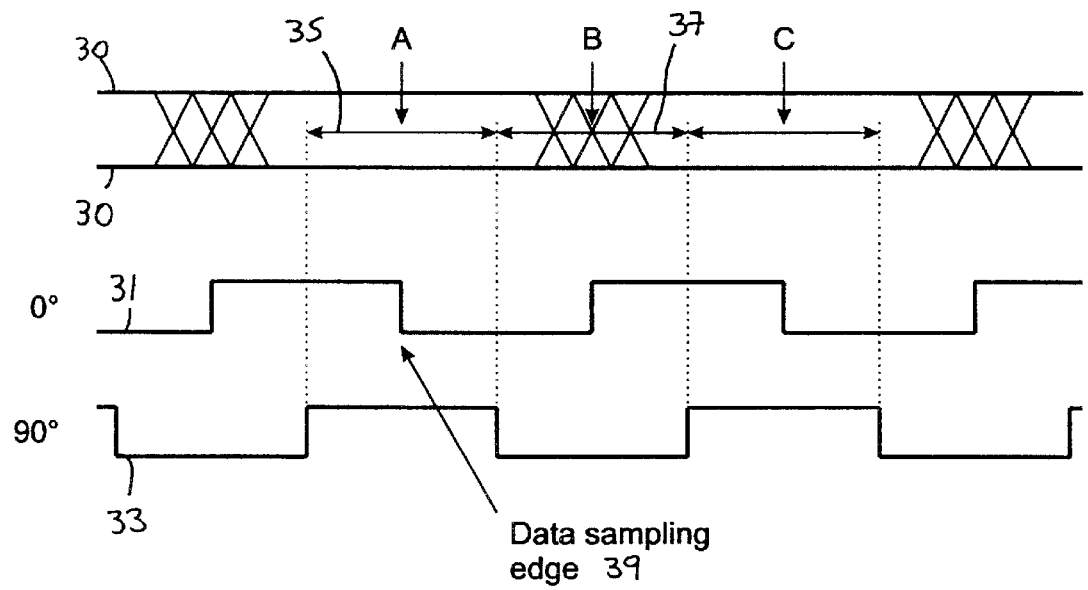
FIG. 3 shows a data signal along with a data sampling clock signal and a 90° phase shifted clock signal detecting the lock status of the signal.

In FIG. 3, a data signal 30 is shown along with the data sampling clock signal 31 and the 90° phase shifted clock signal 33 detecting the lock status of the signal. The eye pattern which describes and/or characterises the data signal 30 is seen, the period 35 being the eye opening or the data sampling period and the period 37 being the transition period. The optimum sampling time is in the center of the eye opening 35 as indicated by the arrow A and when the clock and data signals are in lock, the data sampling edge 39 will sample the data signal in the center A of the eye opening 35. The transition period 37 is the period where the data transitions preferably occurs. I.e. if the clock and data signals are in lock, the data transitions will occur substantially at the time B in the center of the transition period and the data signal will be sampled substantially at the time A in the center of the data sampling period.

Figure 4:
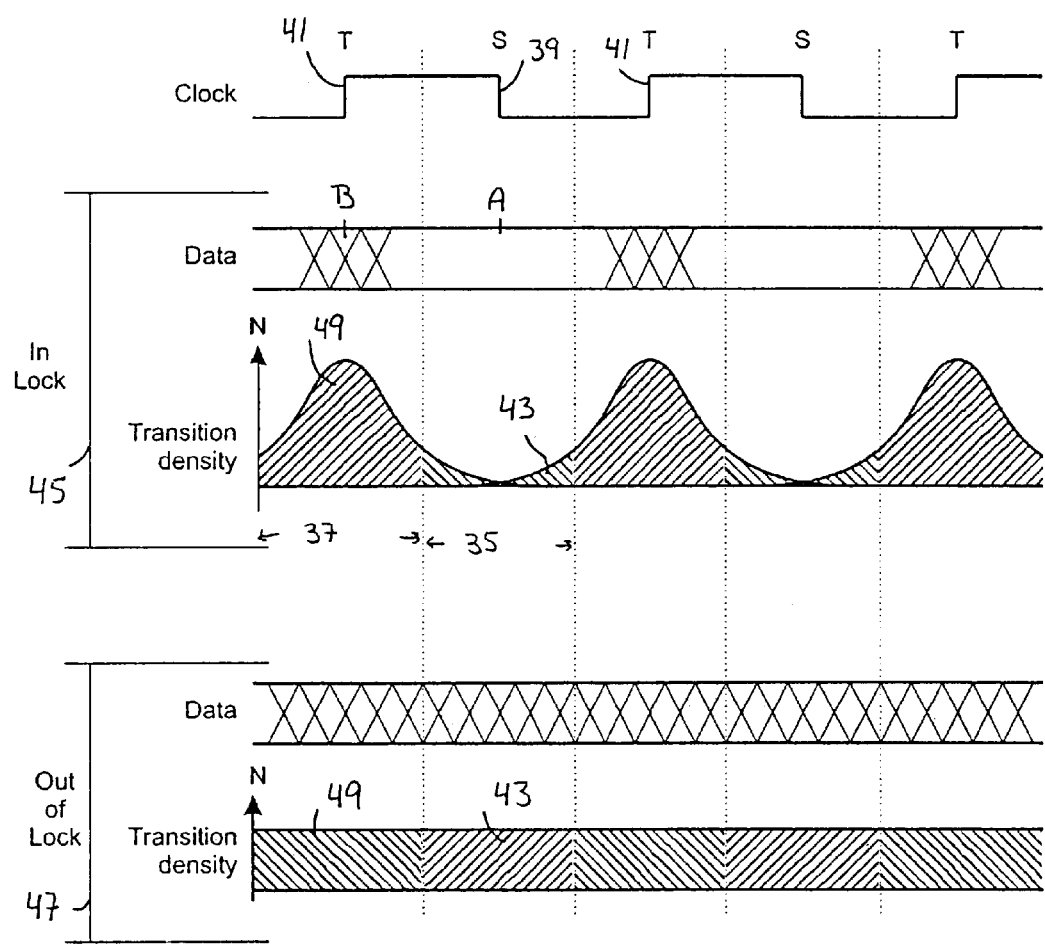
FIG. 4 shows the transition density for a system in lock and a system out of lock, respectively.

In FIG. 4, the clock signal is shown having positive data transition edges 41 and negative data sampling edges 39. Furthermore, the data signal and the corresponding transition density is shown in the case where the signals are in lock 45, and in the case where the signals are out of lock 47.

When the data signal and the clock signal are in lock 45, the majority of the data transitions will take place in a partial period centered around the data transition edge 41 of the clock signal, i.e. in a first partial period centered around the center B of the data transition period 37, and the hatched area 49 indicates the number of transitions in this period. In the data sampling period, the second partial period, 35, there will be a small number of data transitions as indicated by the hatched area 43. A minimum of data transitions will occur in the center A of the second partial period 35, i.e. in the center of the eye in the eye pattern, which is the optimum sampling time, and the data sampling period is, thus, centered around the data sampling edge 39.

When the data signal and the clock signal are out of lock, the data transitions are not limited to a specific partial period, but will occur at any time during the data transition period and the data sampling period. It is, thus, not possible to see a difference in the transition density between the data transition period 37, the hatched area 49, and the data sampling period 35, the hatched area 43. The lock detection system and method described above, may therefore be adapted to detect the difference in the transition density in the first and second partial period, i.e. in the data transition period and the data sampling period, and to set the lock signal if the difference in transition density falls below a predetermined level. The data signal and the clock signal then being locked again when there is a significant difference between the transition density in first and the second partial period. Preferably, to verify that the system has caught lock again, the difference between the transition density in the first and the second period should be larger than when the lock signal is set, so as to ensure that the system has been stabilized before data is sampled again.

What is claimed is:

1. A lock detection method comprising receiving, by a lock detection unit, a data signal and a clock signal, the data signal and the clock signal being in lock when a data transition occurs in the center of a first transition period, detecting for a data transition of the data signal in a first partial period centered around the center of the first transition period and generating a first output signal having a first logic value in response to the presence of a data transition in the first partial period and having a second logic value in response to the absence of a data transition in the first partial period, detecting for a data transition of the data signal in a second partial period centered around the center of an eye opening period and generating a second output signal having a first logic value in response to the absence of a data transition in the second partial period and having a second logic value in response to the presence of a data transition in the second partial period, and comparing the first and second output signals; and generating a lock signal according to the comparison.

2. The lock detection method according to claim 1, wherein the data signal and the clock signal are locked in a phase or frequency locked loop.

3. The lock detection method according to claim 2 further comprising:

enabling a VCO sweep generator coupled to the phase or frequency locked loop if the lock signal is set.

4. The lock detection method according to claim 1, generating the lock signal further comprising:

incrementing a counter in response to the first output signal; and decrementing the counter in response to the second output signal.

5. The lock detection method according to claim 4 further comprising:
   setting the lock signal if the counter is not incremented to a reference value.

6. The lock detection method according to claim 1, generating the lock signal further comprising:
   charging a comparator in response the to first output signal; and
   discharging the comparator in response to the second output signal.

7. The lock detection method according to claim 6 further comprising:
   setting the lock signal if the comparator is discharged below a reference value.

8. A lock detection system comprising
   a phase or frequency locked loop to provide a data signal and a clock signal, the data signal and the clock signal being in lock when a data transition occurs in the center of a first transition period;
   a lock detection unit to detect a data transition of the data signal in a first partial period centered around the center of the first transition period and generate a first output signal having a first logic value in response to the presence of a data transition in the first partial period and having a second logic value in response to the absence of a data transition in the first partial period,
   detect a data transition of the data signal in a second partial period centered around the center of an eye opening period and generate a second output signal having a first logic value in response to the absence of a data transition in the second partial period and having a second logic value in response to the presence of a data transition in the second partial period; and
   comparing means to compare the first and second output signals and to generate a lock signal according to the comparison.

9. A lock detection system according to claim 8, wherein the phase or frequency locked loop comprises a VCO, and wherein a VCO sweep generator is configured to operate if the lock signal is set.

10. A lock detection system according to claim 8, wherein the comparing means comprises a counter configured to increment in response to the first output signal and decrement in response to the second output signal.

11. A lock detection system according to claim 10, wherein the counter is further configured to set the lock signal if not incremented to a reference value.

12. A lock detection system according to claim 8, wherein comparing means comprises a comparator configured to charge in response to the first output signal and discharge in response to the second output signal.

13. A lock detection system according to claim 12, wherein the comparator is configured to set the lock signal if discharged below a predetermined reference value.

* * * * *

UNITED STATES PATENT AND TRADEMARK OFFICE
CERTIFICATE OF CORRECTION

PATENT NO. : 6,785,354 B1
DATED : August 31, 2004
INVENTOR(S) : Dietrich

It is certified that error appears in the above-identified patent and that said Letters Patent is hereby corrected as shown below:

Column 8,
Line 27, delete "predetermined".

Signed and Sealed this

Thirty-first Day of May, 2005

JON W. DUDAS
*Director of the United States Patent and Trademark Office*